US006901659B1

(12) United States Patent
Mishima

(10) Patent No.: US 6,901,659 B1
(45) Date of Patent: Jun. 7, 2005

(54) METHOD OF MANUFACTURING ELECTRON-EMITTING DEVICE USING INK-JET DISCHARGE DEVICE

(75) Inventor: Seiji Mishima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 411 days.

(21) Appl. No.: 09/694,268

(22) Filed: Oct. 24, 2000

Related U.S. Application Data

(63) Continuation of application No. PCT/JP00/01024, filed on Feb. 23, 2000.

(30) Foreign Application Priority Data

Feb. 24, 1999 (JP) ........................................... 11-047095

(51) Int. Cl.[7] ............................ H05K 3/10; B05D 5/12; C23C 16/06

(52) U.S. Cl. ........................ 29/846; 427/96.1; 427/229; 427/295; 427/422; 427/427; 427/126.1; 118/50.1; 118/720; 118/724

(58) Field of Search ................................ 29/846, 890.1; 427/96, 126.3, 126.5, 295, 229, 421, 422, 427, 126.1, 62, 96.1, 96.8, 96.7, 421.1; 118/50.1, 720, 724

(56) References Cited

U.S. PATENT DOCUMENTS

| | | | | |
|---|---|---|---|---|
| 4,239,809 A | * | 12/1980 | Lampkin et al. | 427/427 X |
| 4,460,904 A | | 7/1984 | Oszczakiewicz et al. | 364/75 |
| 5,171,610 A | * | 12/1992 | Liu | 427/126.3 X |
| 5,866,195 A | * | 2/1999 | Lemelson | 427/62 |

FOREIGN PATENT DOCUMENTS

| | | | | |
|---|---|---|---|---|
| EP | 0 735 388 A2 | | 10/1996 | |
| JP | 59-96970 A | | 6/1908 | |
| JP | 53-042619 | | 4/1978 | |
| JP | 53-42619 | | 11/1978 | |
| JP | 54-57894 | * | 5/1979 | 427/96 |
| JP | 54-139534 A | | 10/1979 | |
| JP | 55-31183 | * | 3/1980 | 427/229 X |
| JP | 58-204625 A | | 11/1983 | |
| JP | 61-32989 A | | 2/1986 | |
| JP | 61-32989 B | | 7/1986 | |
| JP | 8-171850 | | 7/1996 | |
| JP | 8-327816 | | 12/1996 | |
| JP | 09-069334 | | 3/1997 | |
| JP | 11-42771 | | 2/1999 | |
| JP | 11-042771 A | | 2/1999 | |

OTHER PUBLICATIONS

Zoler et al, "A New Electrothermal–Chemical Method for Metals Carbides and Ceramics Hard Coating: Experiment and Theory" IEEE International Conference on Plasma Science, ICOPS'99, 1999, p. 211.*

* cited by examiner

*Primary Examiner*—A. Dexter Tugbang
(74) *Attorney, Agent, or Firm*—Fitzpatrick, Cella, Harper & Scinto

(57) ABSTRACT

An electron-emitting device manufacturing method comprising a gas removal step of removing a gas dissolved in a liquid containing a formation material of an electroconductive film in which an electron emitting area is to be formed, a temperature adjusting step of adjusting a temperature of the liquid from which the gas is removed, and a droplet discharge step of discharging droplets of which the temperature is adjusted by droplet discharge means in an ink jet manner, while controlling relative positions of the droplet discharge means and a substrate on which the electroconductive film in which the electron-emitting area is to be formed is formed. The droplets are thereby applied to a predetermined position on the substrate.

4 Claims, 11 Drawing Sheets

(a)

(b)

(a)

(b)

(a)

(b)

METHOD OF MANUFACTURING ELECTRON-EMITTING DEVICE USING INK-JET DISCHARGE DEVICE

This application is a continuation of International Application No. PCT/JP00/01024, filed Feb. 23, 2000, which claims the benefit of Japanese Patent Application No. 11-047095, filed Feb. 24, 1999.

TECHNICAL FIELD

The present invention relates to an electronic device manufacturing method and a manufacturing apparatus therefor and, more particularly, to a manufacturing method for an electronic device by the step of applying, to a substrate, droplets of a liquid containing the formation material of a member which constitutes the electronic device, and a manufacturing apparatus therefor.

BACKGROUND ART

As a method of easily manufacturing a surface-conduction type electron-emitting element at low cost, there is conventionally proposed a method like the one disclosed in Japanese Laid-Open Patent Application No. 8-171850 in which droplets of a metal-containing solution are discharged onto a substrate using a droplet discharge unit to form element electrodes and a conductive film between them, thereby manufacturing an element, as shown in FIG. 11. In FIG. 11, reference numeral 1 denotes a substrate; 2 and 3, element electrodes; 4, a conductive film; and 5, an electron-emitting portion.

An electron source substrate having electron-emitting elements arrayed in a matrix, and an image forming apparatus are formed on an insulating substrate.

As another example of manufacturing an electronic device other than the electron-emitting element and electron source by using an ink-jet method, Japanese Laid-Open Patent Application No. 8-327816 discloses a color filter manufacturing method using the ink-Jet method.

However, forming the building component of the electronic device using the ink-jet method suffers the following problems. That is, discharge of a solution is inhibited by a gas dissolved in the solution when the solution containing a material for forming the building component of the electronic device contacts air, and by bubbles and the like mixed in injecting the solution into the droplet discharge unit. As a result, the droplet discharge amount may vary. The droplet discharge direction may be influenced by this state, and the landing position when a droplet lands on the insulating substrate may offset from a design value.

In addition, the temperature of the solution changes depending on the ambient temperature of the unit to change physical properties such as the viscosity of the solution. The droplet discharge amount may vary. The droplet discharge direction may be influenced by this state, and the landing position when a droplet lands on the insulating substrate may offset from a design value.

Hence, the yield in manufacturing an electronic device is difficult to increase, and the production cost increases. In the electron source, the uniformity of the conductive thin film of an electron-emitting element is impaired to decrease the yield of an electron source substrate.

It is, therefore, an object of the present invention to provide an electronic device manufacturing method and manufacturing apparatus which can discharge a solution to an accurate position on a substrate, and are excellent in reproducibility of the characteristics of a manufactured electronic device.

It is another object of the present invention to provide a manufacturing method and manufacturing apparatus which can discharge a solution to an accurate position on a substrate, for an electron source having a plurality of electron-emitting portions with uniform electron emission characteristics.

It is still another object of the present invention to provide a manufacturing method for a high-quality image forming apparatus having uniform emission luminance.

DISCLOSURE OF THE INVENTION

According to one aspect of the present invention, an electronic device manufacturing apparatus is characterized by comprising gas removal means for removing a gas dissolved in a liquid containing a formation material of a member constituting an electronic device, droplet discharge means for discharging droplets of the liquid, and means for controlling relative positions of the droplet discharge means and a substrate on which the electronic device is formed, wherein the droplets are applied to a predetermined position on the substrate.

In this invention, the gas removal means comprises a closed vessel filled with a membrane formed from a semi-transmitting film capable of transmitting a gas, and a vacuum unit for evacuating the closed vessel.

In this invention, the gas removal means comprises means for adjusting a flow rate of the liquid in the membrane.

In this invention, the gas removal means comprises means for detecting an amount of gas contained in the liquid.

In this invention, the gas removal means comprises a vacuum unit, and exposes a solution containing the liquid to vacuum.

In this invention, the vacuum unit has a variable exhaust speed.

In this invention, the gas removal means comprises means for detecting a vacuum degree of the vacuum unit.

In this invention, the droplet discharge means generates a bubble in the liquid using thermal energy, and discharges the liquid on the basis of generation of the bubble.

In this invention, the droplet discharge means discharges the liquid using kinematic energy.

According to another aspect of the present invention, an electronic device manufacturing apparatus comprises means for adjusting a temperature of a liquid containing a formation material of a member constituting the electronic device, droplet discharge means for discharging droplets of the liquid, and means for controlling relative positions of the droplet discharge means and a substrate on which the electronic device is formed, wherein the droplets are applied to a predetermined position on the substrate.

In this invention, the droplet discharge means generates a bubble in the liquid using thermal energy, and discharges the liquid on the basis of generation of the bubble.

In this invention, the droplet discharge means discharges the liquid using kinematic energy.

In this invention, the electronic device includes an electron source having a plurality of electron-emitting elements.

In this invention, each electron-emitting element includes an electron-emitting element having a pair of conductors arranged at a gap.

In this invention, the droplet discharge means includes means for discharging droplets of the liquid containing a formation material of the conductors.

In this invention, the electron source includes an electron source having a plurality of electron-emitting element arrays each formed by connecting a plurality of electron-emitting elements between a pair of wiring lines.

In this invention, the electron source includes an electron source constituted by connecting a plurality of electron-emitting elements in a matrix by a plurality of row-direction wiring lines and a plurality of column-direction wiring lines.

According to still another aspect of the present invention, an electron source substrate manufacturing apparatus for manufacturing an electron source substrate-having a plurality of pairs of element electrodes formed on a substrate, conductive films each having an electron-emitting portion formed between each pair of element electrodes, and a voltage application terminal to each element electrode, is characterized by comprising gas removal means for removing a gas dissolved in a solution containing a metal element, droplet discharge means for discharging droplets of the solution containing the metal element, and means for controlling relative positions of the droplet discharge means and the substrate, wherein the droplets are applied to a predetermined position on the substrate.

In this invention, the gas removal means comprises a closed vessel filled with a membrane formed from a semi-transmitting film capable of transmitting a gas, and a vacuum unit for evacuating the closed vessel.

In this invention, the gas removal means comprises means for adjusting a flow rate of a metal solution in the membrane.

In this invention, the gas removal means comprises means for detecting an amount of gas contained in the solution.

In this invention, the gas removal means comprises a vacuum unit, and exposes a solution containing a metal solution to vacuum.

In this invention, the vacuum unit has a variable exhaust speed.

In this invention, the gas removal means comprises means for detecting a vacuum degree of the vacuum unit.

According to still another aspect of the present invention, an electron source substrate manufacturing apparatus for manufacturing an electron source substrate having a plurality of pairs of element electrodes formed on a substrate, conductive films each having an electron-emitting portion between each pair of element electrodes, and a voltage application terminal to each element electrode, is characterized by comprising means for adjusting a temperature of a solution containing a metal element, droplet discharge means for discharging droplets of the solution containing the metal element, and means for controlling relative positions of the droplet discharge means and the substrate, wherein the droplets are applied to a predetermined position on the substrate.

In this invention, the droplet discharge means generates a bubble in the solution using thermal energy, and discharges the solution on the basis of generation of the bubble.

In this invention, the droplet discharge means discharges the solution using kinematic energy.

In this invention, the solution containing the metal element contains a formation material of the conductive film in which the electron-emitting portion is formed.

According to still another aspect of the present invention, an electronic device manufacturing method is characterized by comprising the gas removal step of removing a gas dissolved in a liquid containing a formation material of a member constituting an electronic device, and the droplet discharge step of discharging droplets by droplet discharge means while controlling relative positions of the droplet discharge means for discharging droplets of the liquid and a substrate on which the electronic device is formed, thereby applying the droplets to a predetermined position on the substrate.

In this invention, the gas removal step comprises controlling a concentration of the gas dissolved in the liquid so as to be kept at a default value.

In this invention, the droplet discharge means generates a bubble in the liquid using thermal energy, and discharges a solution on the basis of generation of the bubble.

In this invention, the droplet discharge means discharges the liquid using kinematic energy.

According to still another aspect of the present invention, an electronic device manufacturing method is characterized by comprising the temperature adjusting step of adjusting a temperature of a liquid containing a formation material of a member constituting an electronic device, and the droplet discharge step of discharging droplets by droplet discharge means while controlling relative positions of the droplet discharge means for discharging droplets of the liquid and a substrate on which the electronic device is formed, thereby applying the droplets to a predetermined position on the substrate.

In this invention, the droplet discharge means generates a bubble in the liquid using thermal energy, and discharges the liquid on the basis of generation of the bubble.

In this invention, the droplet discharge means discharges the liquid using kinematic energy.

In this invention, the electronic device includes an electron source having a plurality of electron-emitting elements.

In this invention, each electron-emitting element includes an electron-emitting element having a pair of conductors arranged at a gap.

In this invention, the liquid includes a liquid containing a formation material of the conductors.

In this invention, the electron source includes an electron source having a plurality of electron-emitting element arrays each formed by connecting a plurality of electron-emitting elements between a pair of wiring lines.

In this invention, the electron source includes an electron source constituted by connecting a plurality of electron-emitting elements in a matrix by a plurality of row-direction wiring lines and a plurality of column-direction wiring lines.

According to still another aspect of the present invention, an electron source substrate manufacturing method of manufacturing an electron source substrate having a plurality of pairs of element electrodes formed on a substrate, conductive films each having an electron-emitting portion formed between each pair of element electrodes, and a voltage application terminal to each element electrode, is characterized by comprising the gas removal step of removing a gas dissolved in a solution containing a metal element, and the droplet discharge step of discharging droplets by droplet discharge means while controlling relative positions of the substrate and the droplet discharge means for discharging droplets of the solution, thereby applying the droplets to a predetermined position on the substrate.

In this invention, the gas removal step comprises controlling a concentration of the gas dissolved in the solution so as to be kept at a default value.

In this invention, the droplet discharge means generates a bubble in the solution using thermal energy, and discharges the solution on the basis of generation of the bubble.

In this invention, the droplet discharge means discharges the solution using kinematic energy.

According to still another aspect of the present invention, an electron source substrate manufacturing method of manufacturing an electron source substrate having a plurality of pairs of element electrodes formed on a substrate, conductive films each having an electron-emitting portion formed between each pair of element electrodes, and a voltage application terminal to each element electrode, is characterized by comprising the temperature adjusting step of adjusting a temperature of a solution containing a metal element, and the droplet discharge step of discharging droplets by droplet discharge means while controlling relative positions of the substrate and the droplet discharge means for discharging droplets of the solution, thereby applying the droplets to a predetermined position on the substrate.

In this invention, the droplet discharge means generates a bubble in the solution using thermal energy, and discharges the solution on the basis of generation of the bubble.

In this invention, the droplet discharge means discharges the solution using kinematic energy.

In this invention, the solution containing the metal element contains a formation material of the conductive film in which the electron-emitting portion is formed.

According to still another aspect of the present invention, an image forming apparatus manufacturing method of manufacturing an image forming apparatus having an electron source substrate and a light-emitting member which emits light upon irradiation of electrons from the electron source substrate, is characterized in that the electron source substrate is manufactured by the electron source substrate manufacturing method described above.

In this case, the electronic device in the present invention includes a color filter for a liquid crystal display, a driving circuit for various displays such as a liquid crystal display, plasma display, and electron beam display, and an electron source substrate itself. The building member of the electronic device formed by the manufacturing method and manufacturing apparatus of the present invention includes a filter element particularly in the color filter, a conductor patterned on a circuit board or an insulator for insulating conductors in the driving circuit for various displays, and building members of a plurality of electron-emitting elements or conductors for connecting the electron-emitting elements to driving wiring lines in the electron source substrate.

By these apparatus and method, the present invention can discharge a solution to an accurate position on a substrate, and can manufacture an electronic device excellent in reproducibility of characteristics.

By these apparatus and method, the present invention can discharge a solution to an accurate position on a substrate, and can manufacture an electron source having a plurality of electron-emitting portions with uniform electron emission characteristics.

By these apparatus and method, the present invention can effectively prevent any color misregistration of the filter element in the color filter, and can prevent any unwanted short-circuiting between driving conductors in the driving circuit for various displays.

By these apparatus and method, the present invention can also realize a small number of steps, high yield, and low cost.

BEST MODE FOR CARRYING OUT THE INVENTION

Preferred embodiments of the present invention will be described below with reference to the accompanying drawings.

Figure 9:
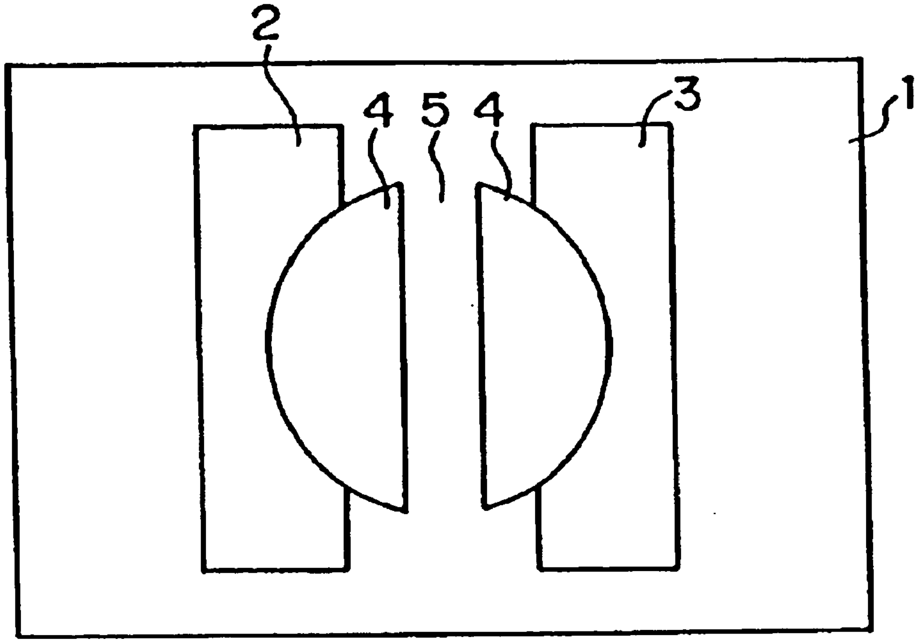
FIGS. 9(*a*) and 9(*b*) are a plan view and a sectional view, respectively, for explaining an example of an electron-emitting element according to the present invention.
Figure 9:
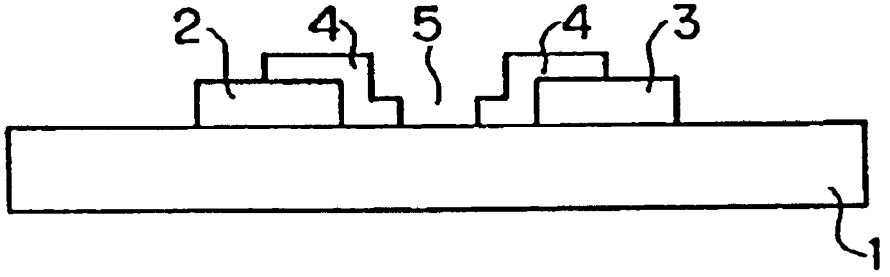

FIG. 9 shows schematic views of an arrangement of a surface-conduction type electron-emitting element used in the following embodiments, in which FIG. 9(*a*) is a plan view, and FIG. 9(*b*) is a sectional view. In FIG. 9, reference numeral 1 denotes a substrate; 2 and 3, element electrodes (conductors); 4, a pair of conductive films (conductors); and 5, a gap between the pair of conductive films.

Figure 10:
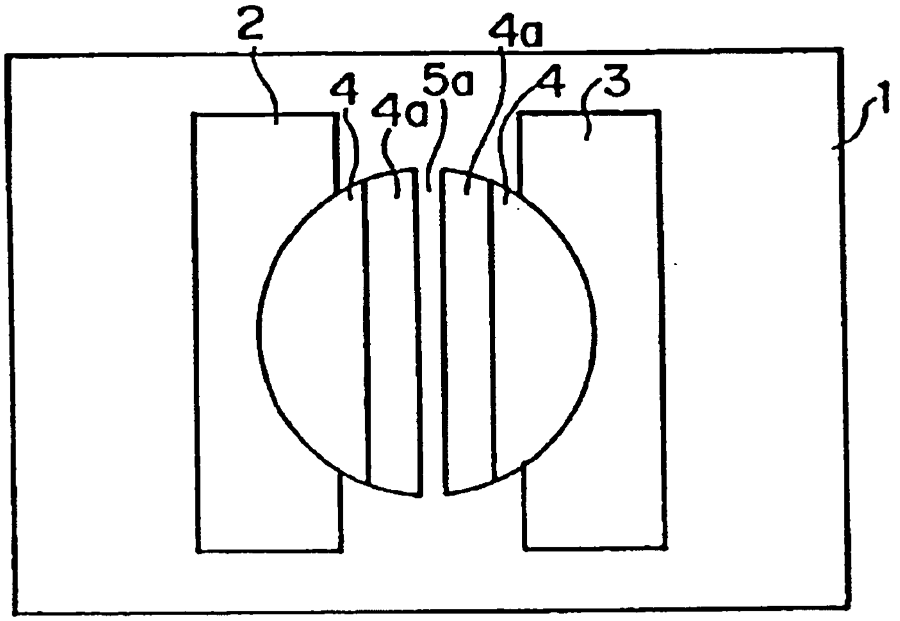
FIGS. 10(*a*) and 10(*b*) are a plan view and a sectional view, respectively, for explaining another example of the electron-emitting element according to the present invention.
Figure 10:
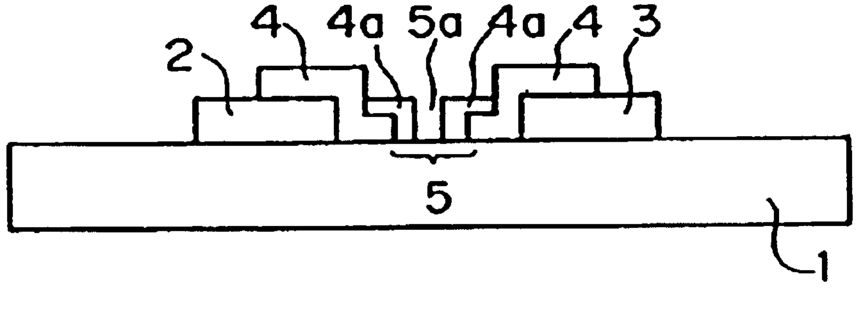
Figure 11:
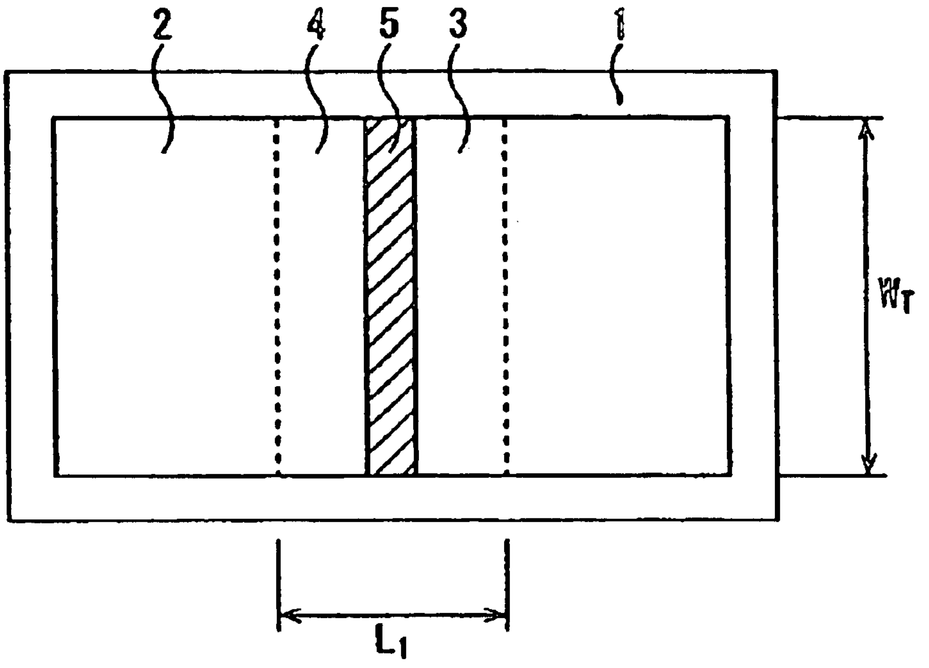
FIG. 11 PRIOR ART
FIGS. 11(*a*) and 11(*b*) are a plan view and a sectional view, respectively, showing a conventional electron-emitting element.
Figure 11:
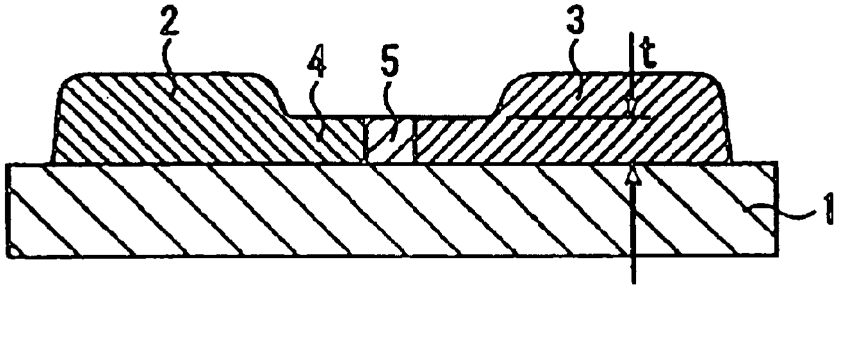
FIG. 11 PRIOR ART

As another arrangement, as shown in FIGS. 10(*a*) and 10(*b*), films 4*a* of carbon or a carbon compound may be formed in the gap 5 and on the conductive films 4. The films of carbon or a carbon compound form a gap 5*a* narrower than the gap 5 to further increase the service life and electron emission efficiency.

This surface-conduction type electron-emitting element emits electrons from the conductive films 4 near the gap 5 or 5*a* by applying a voltage between the element electrodes 2 and 3.

Figure 1:
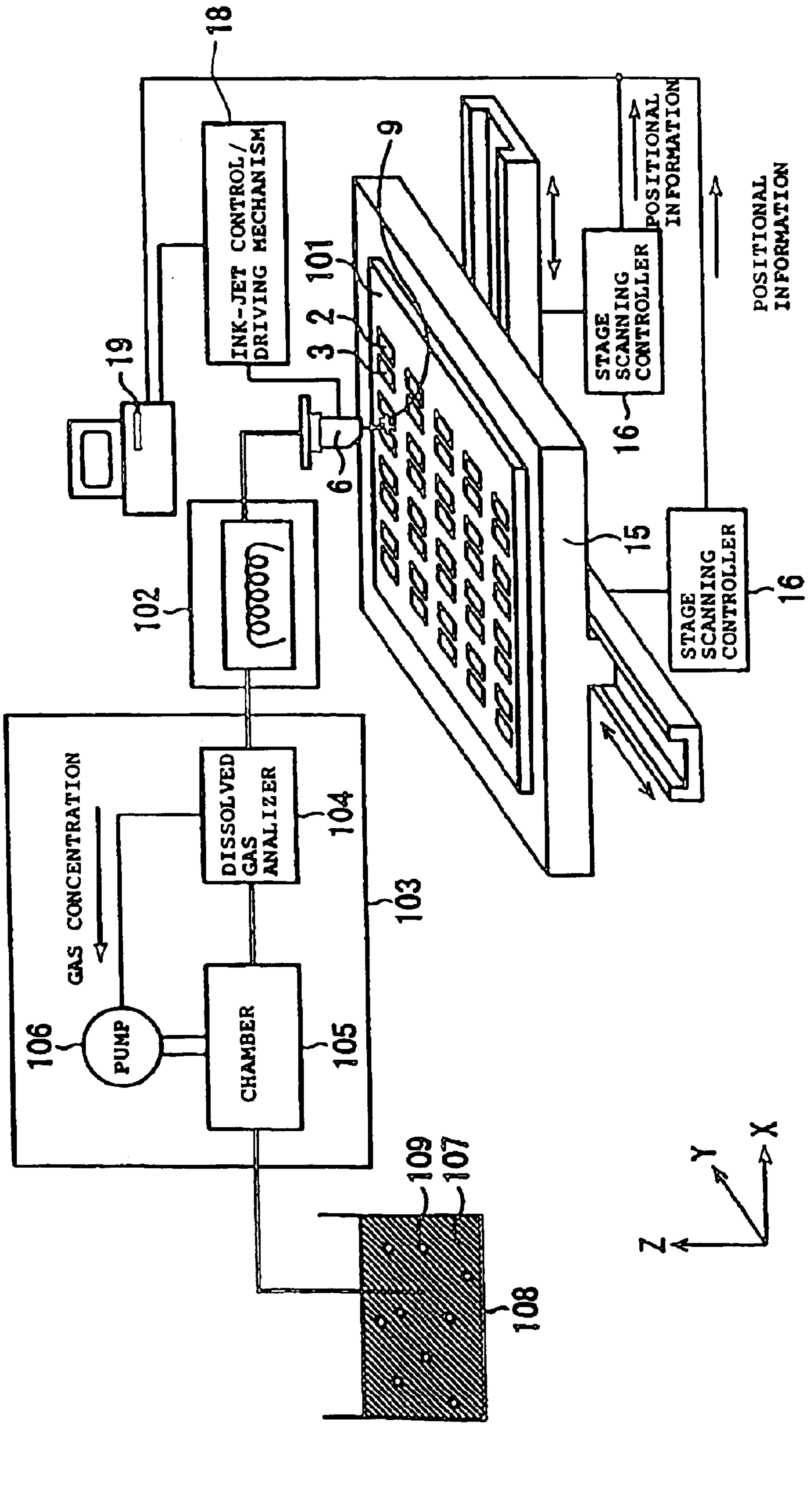
FIG. 1 is a view showing the whole arrangement of an electron source substrate manufacturing apparatus according to the present invention.
Figure 2:
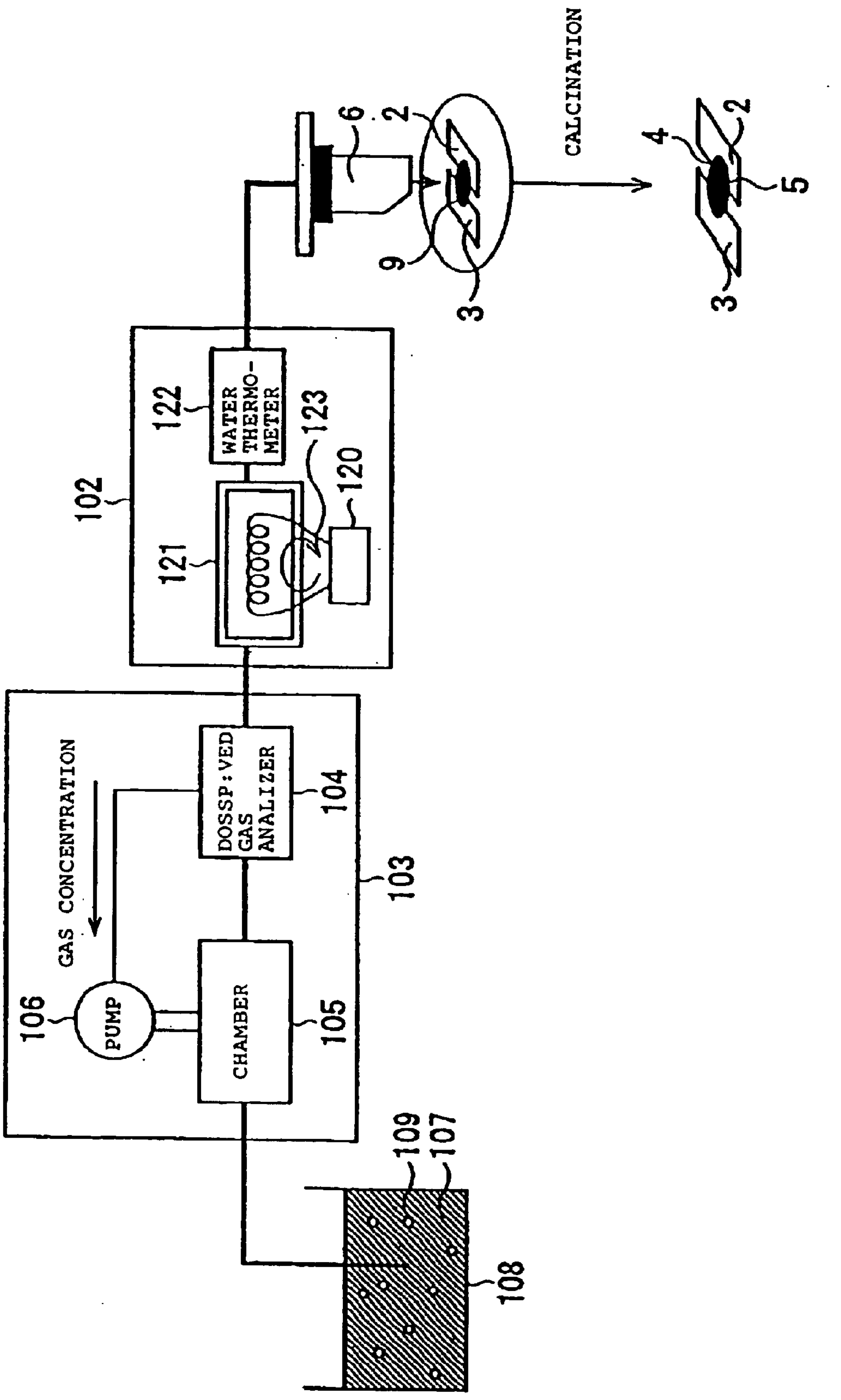
FIG. 2 is an enlarged view showing a system for supplying a metal solution to the droplet applying unit of the electron source substrate manufacturing apparatus according to the present invention.

As an embodiment of the present invention, a method of forming the conductive film 4 of the surface-conduction type electron-emitting element will be described. FIG. 1 is a schematic view showing an electron source substrate manufacturing apparatus using a droplet applying unit of the present invention. FIG. 2 is an enlarged view showing a system for supplying a metal solution to the droplet applying unit in FIG. 1. In FIG. 1, reference numeral 6 denotes a droplet discharge unit; 9, a droplet; 101, a substrate (to be referred to as an MTX substrate hereinafter) immediately before a conductive thin film is formed; 15, a stage having X- and Y-direction scanning mechanisms; 16, a position detecting mechanism; 18, an ink jet control/driving mechanism; and 19, a control computer. In FIG. 2, reference numeral 102 denotes a temperature adjusting unit; 103, a unit for removing a dissolved gas; 104, a unit for measuring the concentration of the dissolved gas; 105, a chamber; 106, a vacuum pump; 107, a solution containing metal elements; and 108, a tank for this solution.

The droplet discharge unit 6 is not limited to a particular unit as far as it can form an arbitrary droplet. The unit 8 can be an ink-jet type unit. The materials of the droplet 9 and solution 107 are not limited to a particular state as far as they can form droplets. The materials can be a solution, organic metal solution, or the like prepared by dispersing/dissolving a metal or the like serving as the component of the conductive thin film in water, a solvent, or the like.

This solution 107 is applied as the droplets 9 to desired positions on the element electrodes 2 and 3 by the droplet discharge unit 6. When the solution 107 contacts outside air, a gas may be dissolved in the solution to increase the dissolved gas amount in the solution 107, or the gas may form bubbles 109, as shown in FIG. 2. If such a gas is directly discharged by the droplet discharge unit, the dissolved gas abnormally bubbles due to abrupt changes in pressure or temperature in the droplet discharge unit to make the discharge amount or discharge direction of the droplet 9 nonuniform.

If the bubbles 109 exist in the solution 107, the solution may not be sufficiently filled depending on the bubble size, and may be injected into the droplet discharge unit 6, failing to discharge the droplets 9. If the temperature of the solution changes depending on the temperature of outside air or the like, the physical properties (concentration, viscosity, and the like) of the solution 107 change to make the discharge amount of the droplet 9 nonuniform.

For this reason, droplets cannot be applied to designed positions, and the yield decreases. To prevent this, the present invention adopts the apparatus shown in FIGS. 1 and 2 to apply droplets to optimal positions for all the elements and increase the yield. The procedures will be described below.

The solution 107 containing a gas is introduced into the unit 103 for removing a dissolved gas. The chamber 105 in the unit 103 selectively transmits the gas to the outside in accordance with the molecular size. In this case, the chamber 105 is formed from a semi-transmitting film. The exhaust speed of the vacuum pump 106 can be controlled by an external signal. The dissolved gas analyzer 104 measures the concentration of the gas dissolved in the solution 107 which has passed through the chamber 105, and can output the concentration.

The solution introduced into the unit 103 is supplied to the chamber 105. The chamber 105 is evacuated by the vacuum pump 106 to selectively exhaust and remove the gas dissolved in the solution 107 through the vacuum pump 106. The gas-removed solution is introduced into the dissolved gas analyzer 104 where the concentration of the gas in the solution is measured. Based on the measurement value, the exhaust speed of the vacuum pump 106 is adjusted to control the concentration of the gas dissolved in the solution 107 to a sufficiently small value.

Figure 4:
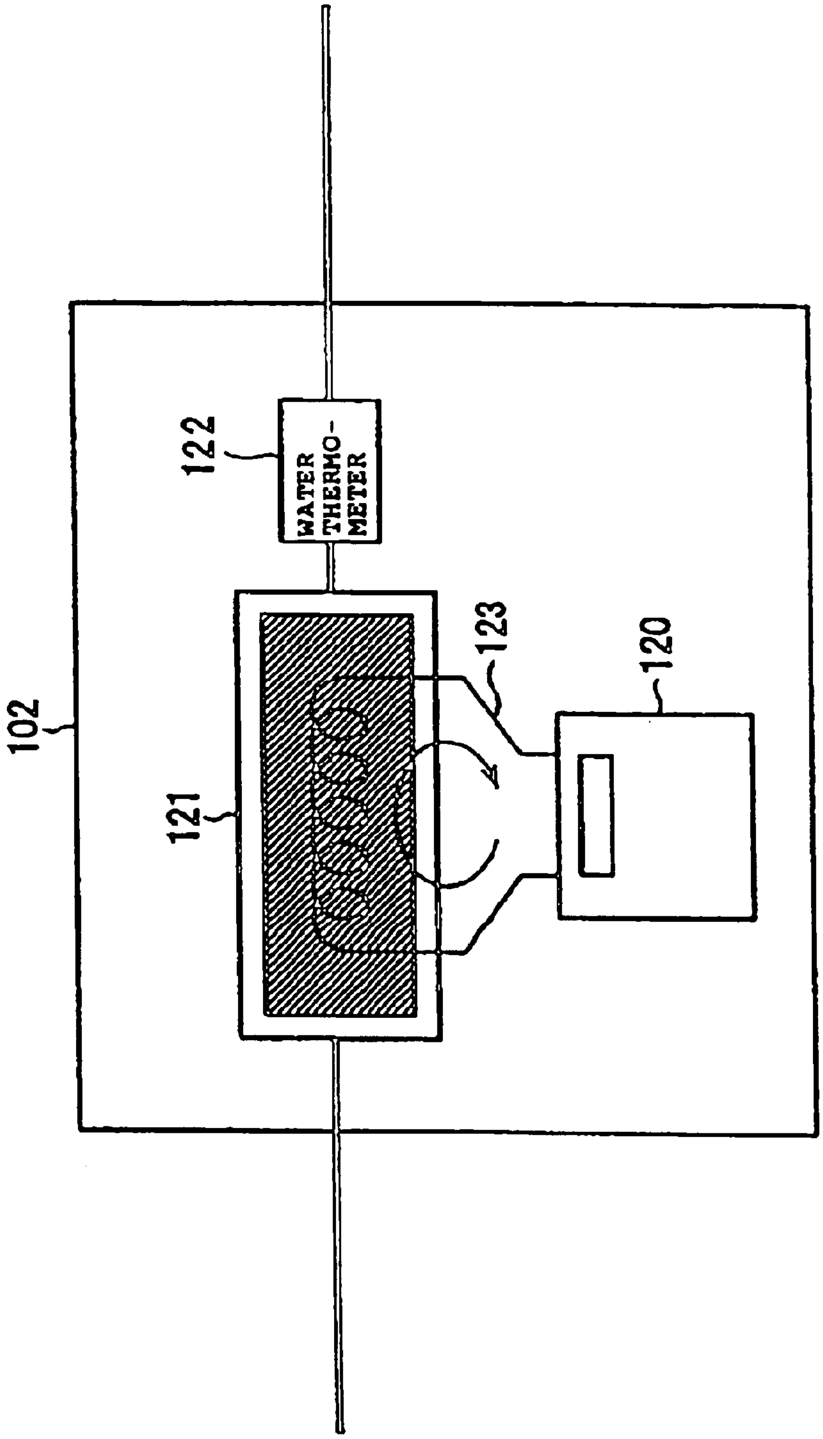
FIG. 4 is an enlarged view showing details of a temperature adjusting unit according to the first embodiment of the present invention.

After these steps, the solution 107 having passed through the dissolved-gas removing unit is controlled to a desired temperature by the temperature adjusting unit 102. As shown in FIG. 4, the temperature adjusting unit 102 is constituted by a circulator 120, tube 123, constant-temperature bath 121, and water thermometer 122. The circulator 120 is controlled to set the temperature of the metal solution 107 detected by the water thermometer 121 to a default value.

After these steps, the metal solution 107 kept at the temperature of the default value is introduced into the droplet discharge unit 6. The droplet discharge unit 8 discharges the droplets 9 in synchronism with scanning of the stage 15, and applies them to desired positions on the MTX substrate 101.

Then, the droplet-applied MTX substrate 101 is calcinated at 300° C. to 400° C. to form the conductive films 4.

A step, called the electrification forming step, of applying a voltage between the element electrodes 2 and 3 from a power supply (not shown) is performed to form a fissure (gap 5) in part of the conductive films 4, thereby forming electron-emitting portions in the conductive films 4. Processing called the activation step is performed for an element having undergone the electrification forming step to deposit the films **4*a* of carbon or a carbon compound on the conductive films (see FIG. 10**).

A method of manufacturing an image forming apparatus according to the present invention will be described below.

An electron source substrate used for the image forming apparatus is formed by arraying a plurality of surface-conduction type electron-emitting elements on a substrate.

Figure 7:
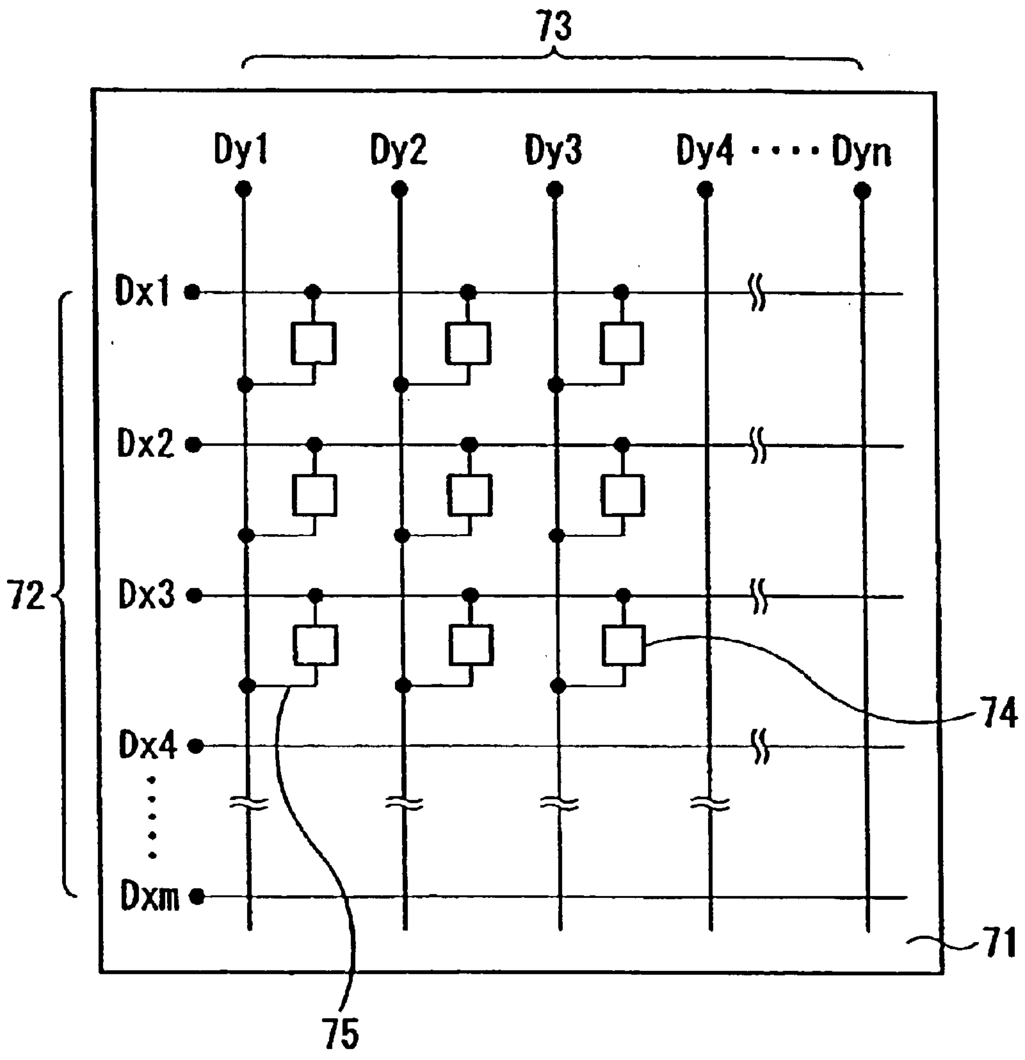
FIG. 7 is a plan view showing an electron source substrate manufactured by the manufacturing apparatus according to the present invention.

As shown in FIG. 7, the surface-conduction type electron-emitting elements are arrayed in a simple matrix (to be referred to as a matrix layout electron source substrate hereinafter) in which a pair of element electrodes are respectively connected to X- and Y-direction wiring lines. In FIG. 7, reference numeral 71 denotes an electron source substrate; 72, an X-direction wiring line; 73, a Y-direction wiring line; 74, a surface-conduction type electron-emitting element; and 75, a connection line.

In FIG. 7, a substrate used for the electron source substrate 71 is the above-mentioned glass substrate or the like, and the shape of the substrate is appropriately set in accordance with the intended use. M X-direction wiring lines 72 are lines Dx1, Dx2, . . . , Dxm, whereas n Y-direction wiring lines 73 are lines Dy1, Dy2, . . . , Dyn.

The wiring line is formed from a conductive metal or the like by vacuum evaporation, printing, sputtering, or the like. The m X-direction wiring lines 72 and n Y-direction wiring lines 73 are electrically isolated by interlevel insulating films (not shown), and constitute matrix wiring (m and n are positive integers). The interlevel insulating film (not shown) is formed from $SiO_2$ or the like by vacuum evaporation, printing, sputtering, or the like. The X-direction wiring lines 72 and Y-direction wiring lines 73 are extracted as external terminals. The surface-conduction type electron-emitting elements 74 are electrically connected to each other by the m X-direction wiring lines 72, n Y-direction wiring lines 73, and connection lines 75.

In this arrangement, individual elements can be selected and independently driven only by simple matrix wiring.

Figure 8:
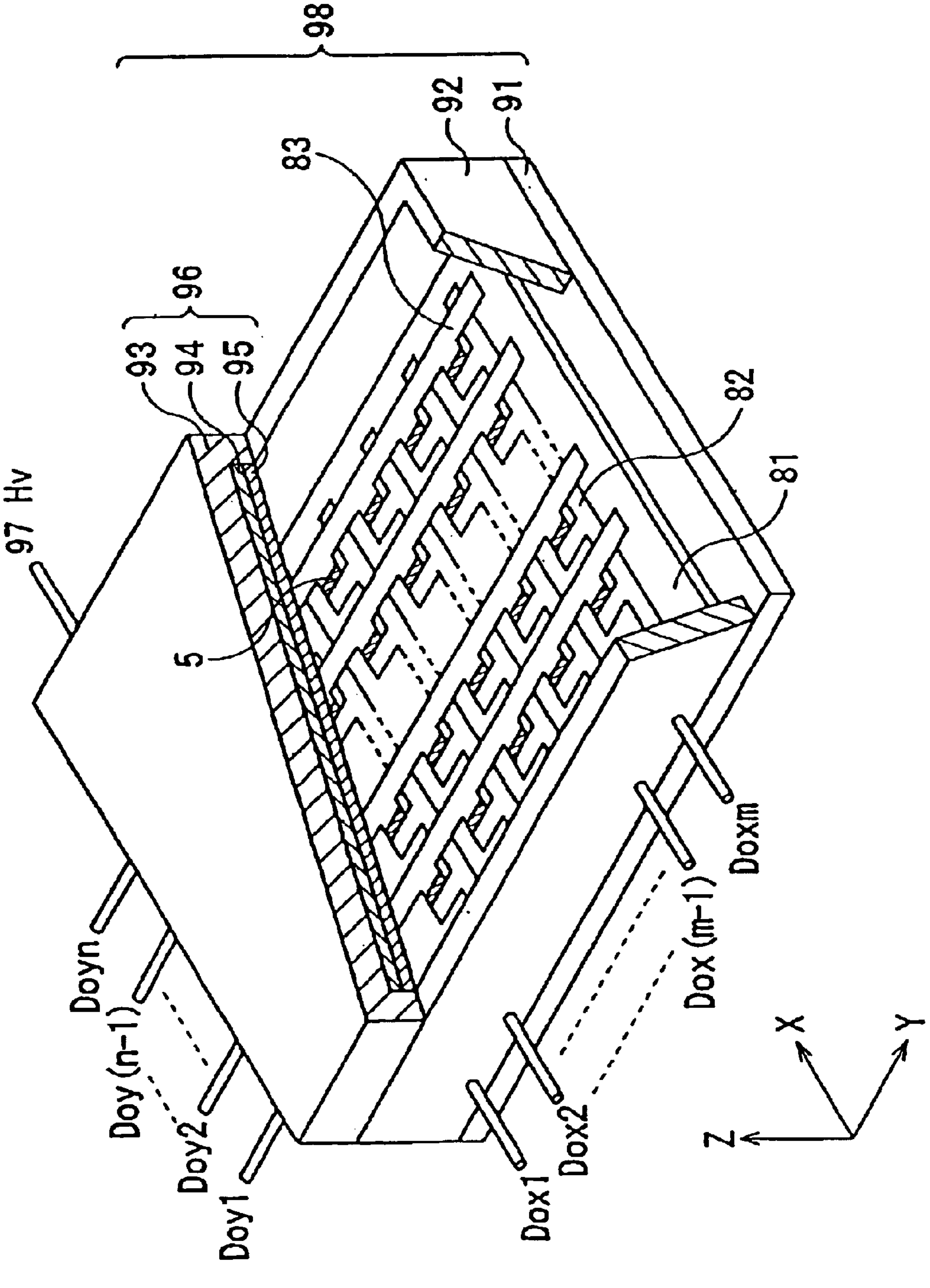
FIG. 8 is a perspective view showing an image forming apparatus manufactured by the manufacturing apparatus according to the present invention.

The image forming apparatus using the manufactured electron source having the simple matrix layout will be explained with reference to FIG. 8. FIG. 8 is a perspective view showing the display panel of the image forming apparatus. In FIG. 8, reference numeral 81 denotes an electron source substrate on which a plurality of surface-conduction type electron-emitting elements are arrayed; 91, a rear plate to which the electron source substrate 81 is fixed; 96, a face plate on which a fluorescent film 94, metal back 95, and the like are formed on the inner surface of a glass substrate 93; and 92, a support frame. By applying and calcinating frit glass, the rear plate 91, support frame 92, and face plate 96 are sealed to constitute an envelope 98. In FIG. 8, reference numerals 82 and 83 denote X- and Y-direction wiring lines respectively connected to a pair of element electrodes of a surface-conduction type electron-emitting element.

The glass substrate 93 is comprised of the face plate 96, support frame 92, and rear plate 91, as described above. Further, an atmospheric pressure resistant support member called a spacer is interposed between the face plate 96 and the rear plate 91 to obtain the envelope 98 highly resistant to the atmospheric pressure.

The envelope 98 is sealed after being evacuated through an exhaust pipe (not shown). To maintain the vacuum degree after the envelope 98 is sealed, getter processing is done. In the image forming apparatus manufactured in this way, voltages are applied to respective surface-conduction type electron-emitting elements via the external terminals DOx1 to DOxm and DOy1 to DOyn of the vessel to emit electrons. A high voltage is applied to the face plate via a high-voltage terminal Hv to accelerate the electron beam. The electron beam is collided against the fluorescent film 94 to excite the fluorescent film 94. The fluorescent film 94 emits light to display an image.

(First Embodiment)

Figure 3:
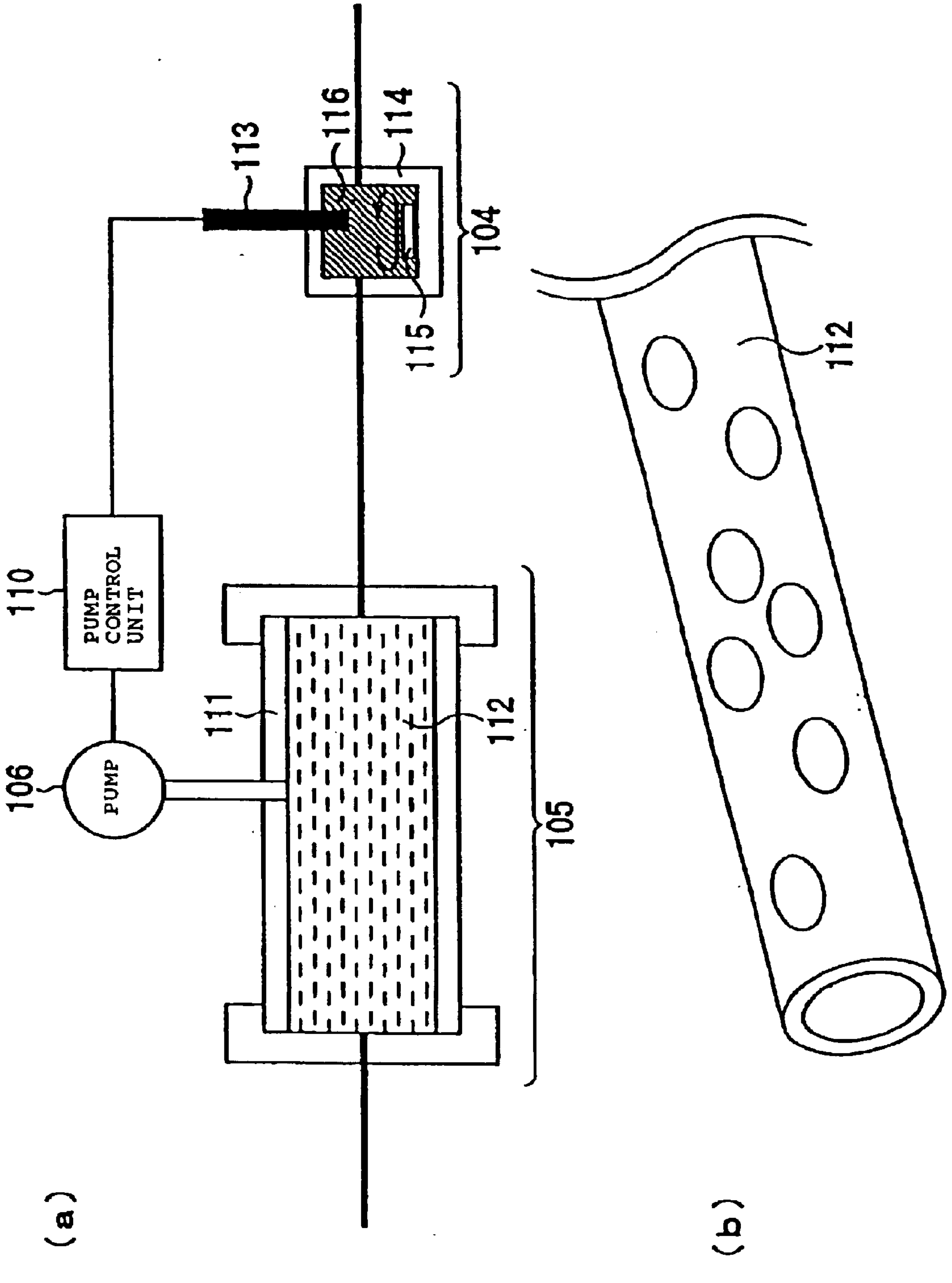
FIG. 3(*a*) is a view showing in detail a unit for removing a dissolved gas according to the first embodiment of the present invention, and FIG. 3(*b*) is a perspective view showing a membrane.

FIG. 1 is a view best showing the feature of the present invention, and shows an apparatus for forming the conductive film of a surface-conduction type electron-emitting element on an electron source substrate according to the present invention. FIG. 1 is a schematic view showing an electron source substrate manufacturing apparatus according to the first embodiment of the present invention. FIG. 2 is an enlarged view showing a system for supplying a metal solution to a droplet applying unit in FIG. 1. FIG. 3 is a view showing in detail a unit for removing a dissolved gas in FIG. 1.

The arrangement of this apparatus, and an electron source substrate manufacturing method using this apparatus will be explained. In FIG. 1, reference numeral 15 denotes a stage to which an MTX substrate 101 is fixed. The stage 15 is coupled to X- and Y-direction scanning mechanisms for moving the stage 15 in the X and Y directions, and can be moved to an arbitrary position in accordance with a signal from a stage scanning controller. The MTX substrate 101 is placed on the stage 15. A surface-conduction type electron-emitting element to be formed on an electron source substrate has the same structure as that shown in FIG. 9, and is made up of a substrate 1, element electrodes 2 and 3, and conductive films 4.

A droplet discharge unit 6 for applying droplets is located above the MTX substrate 101. In the first embodiment, the droplet discharge unit 8 is fixed to the apparatus on the XY plane. The MTX substrate 101 is moved to an arbitrary position by the XY-direction scanning mechanism 15 to realize relative movement of the droplet discharge unit 8 and MTX substrate 101.

The system for supplying a metal solution to the droplet discharge unit will be explained with reference to FIG. 2. In FIG. 2, a metal solution 107 is temporarily stored in a tank 108, and introduced into the droplet discharge unit 6 via a temperature adjusting unit 102 and a unit 103 for removing a dissolved gas. The unit 103 is made up of a chamber 105, a vacuum pump for evacuating the chamber 105, and a dissolved gas analyzer 104. The exhaust speed of the pump is changed based on an output from the dissolved gas analyzer to control the internal pressure of the chamber.

FIGS. 3(*a*) and 3(*b*) show details of the dissolved gas analyzer 104, and the unit 103 for removing a dissolved gas, and FIG. 4 shows details of the temperature adjusting unit. The chamber 105 is comprised of a membrane 112 having a semi-transmitting film, and a vessel 111 which encloses the membrane 112. The vessel 111 is evacuated by a pump 106. As shown in FIG. 3(*b*), the membrane 112 selectively transmits small-size molecules such as a gas via small holes formed in the surface of the membrane. The membrane 112 having this function can be mainly made of poly4-methylpenten. In the first embodiment, the chamber 105 is formed from “SEPAREL” available from Dainippon Ink & Chemicals. The dissolved gas analyzer 104 is formed from a closed vessel 114, and a DO meter 113 for measuring the concentration of oxygen dissolved in the solution. The dissolved gas analyzer 104 determines the concentration of a gas dissolved in the solution on the basis of oxygen dissolved in the solution 107 in the closed vessel 114.

FIG. 4 shows details of the temperature adjusting unit 102. The temperature adjusting unit 102 comprises a circulator 120, tube 123, constant-temperature bath 121, and water thermometer 122. The circulator is used to circulate through the tube 123 a liquid kept at a constant temperature, thereby keeping the temperature of a liquid in the constant-temperature bath 121 constant.

Driving of the droplet discharge unit 6 is controlled by an ink-jet head control/driving unit 18 so as to discharge droplets from the droplet discharge unit 6 at an arbitrary timing. The ink-jet head control/driving unit is controlled by a control computer 19. As the droplet discharge unit 6, an ink-jet type unit can be adopted. This embodiment adopts a bubble-jet type unit.

A method of operating the electron source substrate manufacturing apparatus in the first embodiment will be explained with reference to FIGS. 1 to 3. As described above, the metal solution 107 is introduced into the droplet discharge unit 6, and applied as a droplet 9 to a predetermined position on the MTX substrate 101. The metal solution 107 contains a dissolved gas with an irregular concentration that dissolves from contact air, and bubbles 109 generated by shock or the like. If the metal solution is introduced into the droplet discharge unit 6 in this state, in discharging the droplet 9, (1) The gas dissolved in the metal solution abnormally bubbles owing to abrupt changes in heat or pressure to nonuniformly change the discharge amount or discharge direction of the droplet 9.

(2) The droplet discharge unit 6 is not satisfactorily filled with the metal solution 107 due to bubbles in the metal solution 107, and the droplet 9 greatly decreases in discharge amount or cannot be discharged.

At the same time, the discharge direction also changes nonuniformly to impair the uniformity of the manufactured electron source substrate. Furthermore, the temperature of the solution changes depending on the temperature of outside air or the like, and the physical properties (concentration, viscosity, and the like) of the solution 107 change to make the discharge amount of the droplet 9 nonuniform.

This phenomenon occurs not only when the droplet discharge unit 6 is a bubble-jet type unit as in the first embodiment, but also when the droplet discharge unit 6 is a piezo-jet type unit. The uniformity of the electron source substrate 71 is difficult to maintain, which decreases the yield.

The apparatus of the first embodiment solves this problem by the following procedures, which will be explained with reference to FIGS. 1 to 3.

1. The metal solution 107 is introduced from the solution tank 108 to the chamber 105. At this time, the metal solution 107 contains a gas and the bubbles 109 at an irregular concentration that are generated when the metal solution 107 contacts outside air or shock is applied to the metal solution 107 in the manufacture or safekeeping.

2. The metal solution 107 introduced into the chamber 105 is injected into the membrane 112. By evacuating the chamber by the vacuum pump 106, small-size molecules in the gas and bubbles dissolved in the metal solution 107 transmit through the wall surface of the membrane, and are exhausted outside the chamber. Since the gas and bubbles 109 dissolved in the solution are mainly $N_2$, $O_2$, $CO_2$, the gas in the metal solution can be selectively removed by this method.

3. The metal solution 107 from which the dissolved gas and bubbles 109 are removed in the chamber 105 in step 2 is introduced into the dissolved gas analyzer 104. The metal solution 107 is injected into the closed vessel 114, and the DO meter 113 is inserted into the closed vessel 114 to measure the concentration of the gas dissolved in the metal solution 107. The first embodiment pays attention to $O_2$ among the components of the dissolved gas because the amount of $O_2$ is relatively large and its dissolved amount can be measured at high precision. The dissolved amount of $O_2$ is measured to determine an expected amount of dissolved gas. During measurement, the metal solution 107 is always stirred using a rotator 115 to increase the measurement precision.

4. The exhaust speed of the pump is controlled based on the dissolved $O_2$ concentration measured in step 3 so as to set the dissolved $O_2$ concentration to a proper value for the following purposes.

(i) The dissolved gas is exhausted to a value at which discharge of droplets from the droplet discharge unit 6 satisfactorily stabilizes.

(ii) If the vacuum degree in the chamber 105 excessively decreases, the main component (solvent and the like) of the metal solution 107 is exhausted to change the concentration. To prevent this, the dissolved gas amount must be prevented from excessively decreasing.

5. The metal solution 107 after steps 2 to 4 is introduced into the temperature adjusting unit 102. In the temperature adjusting unit 102, the circulator 120 circulates through the tube 123 a liquid kept at a temperature of 20° C. ±0.2° C. to keep the temperature of the metal solution 107 in the constant-temperature bath 121 constant. The structure of the temperature adjusting unit (the volume of the constant-temperature bath 121, the shape of the fluid passage of the tube 123, and the like) is designed to set the temperature of the metal solution 107 in use to 20° C.±0.3° C. The first embodiment assumes application of droplets at a discharge amount of 50 pl per operation and a discharge frequency of 1 kHz. The volume of the constant-temperature bath is designed to 15 ml.

After the temperature of the metal solution is controlled to a predetermined value by this method, the metal solution is introduced into the droplet discharge unit 6.

In this manner, the droplets 9 containing a conductive film formation material are applied four times. The resultant substrate is heated at 300° C. for 10 min to form thin films from palladium oxide (PdO) at a film thickness of 100 Å as conductive films. A voltage is applied between the pair of electrodes 2 and 3, and electrification processing (electrification forming processing) is performed for the conductive films 4 to form a gap 5 between the conductive films 4.

The manufactured electron source substrate is used to constitute an envelope 98 by a face plate 96, support frame 92, and rear plate 91, as shown in FIG. 8. The envelope 98 is sealed to manufacture a display panel and an image forming apparatus having a driving circuit for performing television display on the basis of an NTSC television signal.

An electron-emitting element manufactured by the manufacturing method of the first embodiment exhibits good characteristics, and the conductive thin film can be uniformly implemented on the substrate with high quality. The present invention can obtain at high yield a high-quality image forming apparatus almost free from variations in element characteristics at the same degree as element characteristics attained by photolithography.

(Second Embodiment)

Figure 5:
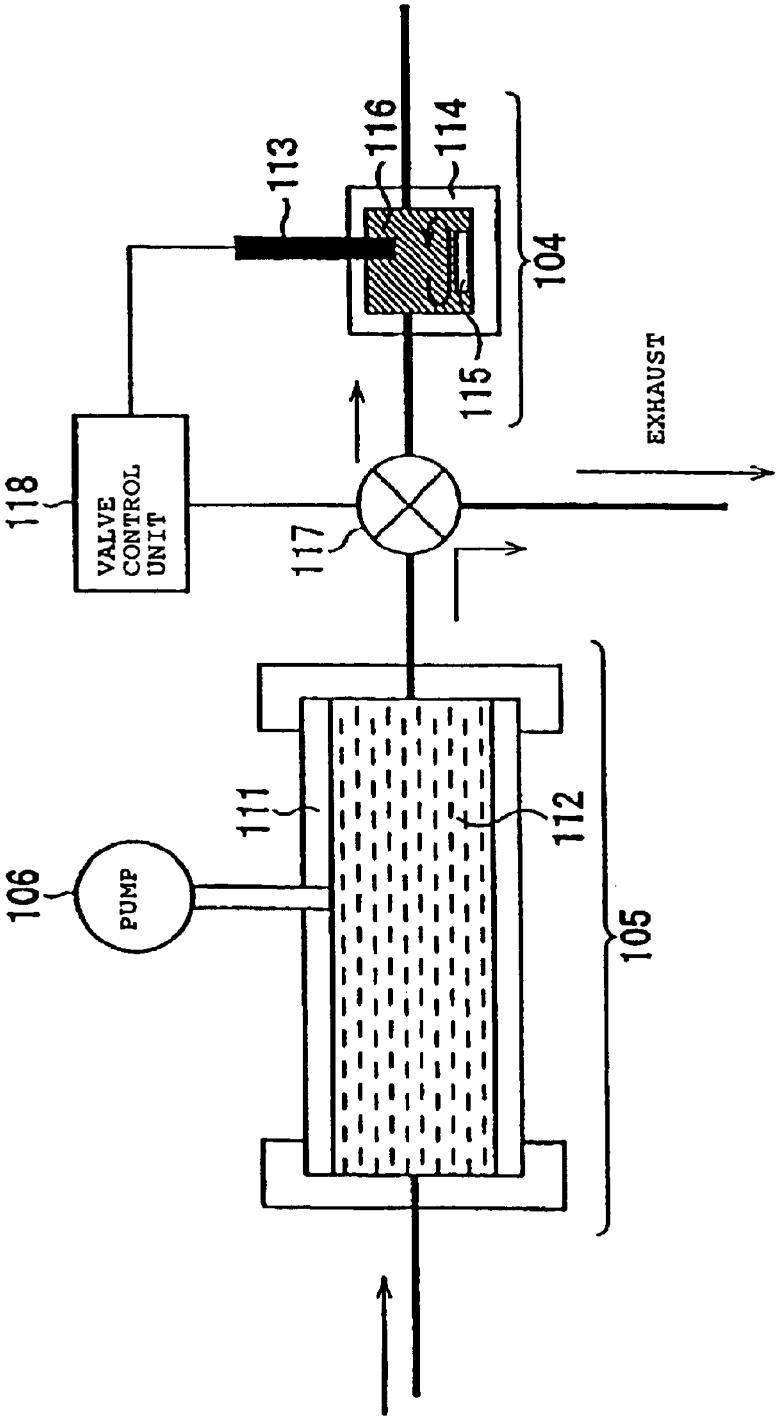
FIG. 5 is a view showing in detail a unit for removing a dissolved gas according to the second embodiment of the present invention.

A method of manufacturing an image forming apparatus having a surface-conduction type electron-emitting element according to the second embodiment of the present invention will be described with reference to FIG. 5. The second embodiment is the same as the first embodiment except that the concentration of a gas dissolved in a metal solution 107 is controlled by the opening degree of a valve 117.

When the exhaust speed of a vacuum pump 106 is set constant, the concentration of the gas dissolved in the metal solution 107 depends on the stay time in a chamber 105. In the second embodiment, the three-way valve 117 is interposed between the chamber 105 and a dissolved gas analyzer 104. The opening degree of the three-way valve 117 is controlled based on a dissolved $O_2$ concentration detected by a DO meter 113, and part of the metal solution 107 is exhausted to the outside. This changes the stay time in the chamber 105 so as to keep the concentration of the gas dissolved in the metal solution 107 constant.

This method can also control the concentration of the gas dissolved in the metal solution 107 to a predetermined value or less, and can increase the yield of the electron source substrate, similar to the first embodiment. The second embodiment realizes the control method using the opening degree of the valve, and thus can simplify the apparatus.

(Third Embodiment)

Figure 6:
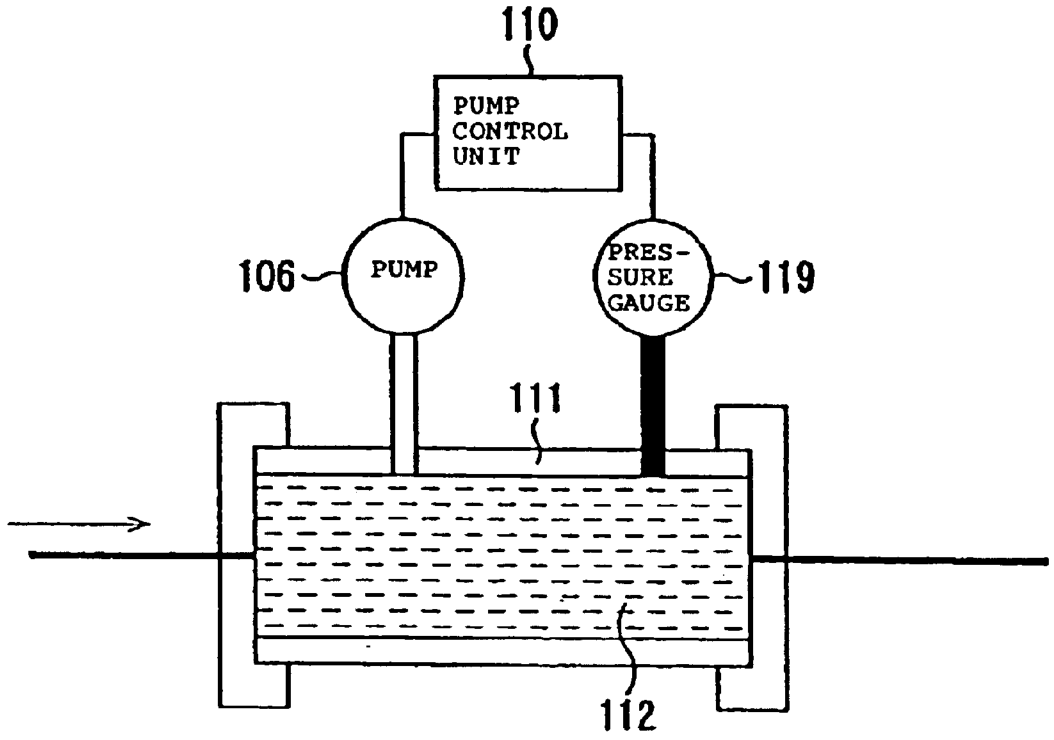
FIG. 6 is a view showing in detail a unit for removing a dissolved gas according to the third embodiment of the present invention.

A method of manufacturing an image forming apparatus having a surface-conduction type electron-emitting element according to the third embodiment of the present invention will be described with reference to FIG. 6. The third embodiment is the same as the first embodiment except that the concentration of a gas dissolved in a metal solution 107 is controlled by a pressure value in a chamber 105.

When discharge of droplets 9 from a droplet discharge unit 6 is maintained at a predetermined speed in manufacturing an electron source substrate, the stay time of the metal solution 107 in the chamber 105 is constant. At this time, the concentration of the gas dissolved in the metal solution 107 depends on the vacuum degree in the chamber 105. From this, as shown in FIG. 6, a pressure gauge 119 is arranged in the chamber 105. A pump control unit 110 is controlled based on the value of the pressure gauge 119 to keep the vacuum degree in the chamber 105 at a proper value.

This method can also control the concentration of the gas dissolved in the metal solution 107 to a predetermined value or less, and can increase the yield of the electron source substrate, similar to the first embodiment. The third embodiment uses the pressure gauge 119 as a method of obtaining the concentration of the dissolved gas, and thus can simplify the apparatus.

INDUSTRIAL APPLICABILITY

The present invention can provide an electronic device manufacturing method and manufacturing apparatus which can discharge a solution to an accurate position on a substrate, and are excellent in reproducibility of the characteristics of a manufactured electronic device.

The present invention can provide a manufacturing method and manufacturing apparatus which can discharge a solution to an accurate position on a substrate, for an electron source having a plurality of electron-emitting portions with uniform electron emission characteristics.

The present invention can provide a manufacturing method for a high-quality image forming apparatus having uniform emission luminance.

An electron source substrate manufactured by these apparatus and method can realize a smaller number of steps, higher yield, and lower cost, compared to the conventional manufacturing method.

What is claimed is:

1. An electron-emitting device manufacturing method comprising:

a gas removal step of removing a gas dissolved in a liquid containing a formation material of an electroconductive film in which an electron-emitting area is to be formed;

a temperature adjusting step of adjusting a temperature of the liquid from which the gas is removed;

a droplet discharge step of discharging droplets of which the temperature is adjusted by droplet discharge means in an ink jet manner while controlling relative positions of the droplet discharge means for discharging droplets of the liquid and a substrate on which the electroconductive film in which the electron-emitting area is to be formed is formed, thereby applying the droplets to a predetermined position on the substrate;

a heat processing step of heat processing the applied liquid to form the electroconductive film; and an energization processing step of energization processing the electroconductive film, wherein the liquid passes a liquid storage tank, a gas removing device and a temperature adjusting device sequentially in that order, and thereafter is introduced into a liquid discharge means operating in the ink jet manner.

2. An electron-emitting device manufacturing method according to claim 1, wherein the gas removal step comprises controlling a concentration of the gas dissolved in the liquid so as to be kept at a default value.

3. An electron-emitting device manufacturing method according to claim 1, wherein, in the droplet discharge step, the droplet discharge means discharges the droplets of adjusted temperature in the ink jet manner onto a plurality of predetermined positions on the substrate, thereby applying the droplets to the predetermined positions on the substrate.

4. An electron-emitting device manufacturing method according to claim 3, wherein the gas removal step comprises controlling a concentration of the gas dissolved in the liquid so as to be kept at a default value.

* * * * *

UNITED STATES PATENT AND TRADEMARK OFFICE

CERTIFICATE OF CORRECTION

PATENT NO. : 6,901,659 B1
DATED : June 7, 2005
INVENTOR(S) : Seiji Mishima

It is certified that error appears in the above-identified patent and that said Letters Patent is hereby corrected as shown below:

Title page,
Item [75], Inventor, "Seiji Mishima, Kanagawa (JP)", should read -- Seiji Mishima, Zama (JP) --.

Column 1,
Line 39, "ink-Jet" should read -- ink-jet --; and
Line 41, "suffers" should read -- suffers from --.

Column 10,
Line 42, "dissolves from contact air," should read -- dissolves from contact with air --.

Signed and Sealed this

Twenty-fifth Day of April, 2006

JON W. DUDAS
*Director of the United States Patent and Trademark Office*